United States Patent [19]

Yazawa

[11] Patent Number: 5,278,559
[45] Date of Patent: Jan. 11, 1994

[54] NOISE SHAPING CIRCUIT HAVING PLURAL FEEDBACK COEFFICIENT MULTIPLIERS

[75] Inventor: Akira Yazawa, Tokyo, Japan

[73] Assignee: NEC Corporation, Tokyo, Japan

[21] Appl. No.: 914,318

[22] Filed: Jul. 17, 1992

[30] Foreign Application Priority Data

Jul. 18, 1991 [JP] Japan .................. 3-178495

[51] Int. Cl.$^5$ .......................................... H03M 3/02
[52] U.S. Cl. ...................................... 341/143; 341/76
[58] Field of Search .................................. 341/143, 76

[56] References Cited

U.S. PATENT DOCUMENTS

| 4,107,669 | 8/1978 | Tewlesbury | 341/143 |
|---|---|---|---|
| 4,301,446 | 11/1981 | Petit | 341/143 |
| 4,860,317 | 8/1989 | Tomlinson | 375/58 |
| 5,144,306 | 9/1992 | Masuda | 341/76 |
| 5,144,308 | 9/1992 | Norsworthy | 341/131 |
| 5,155,743 | 10/1992 | Jacobs | 375/28 |

*Primary Examiner*—Marc S. Hoff
*Attorney, Agent, or Firm*—Leydig, Voit & Mayer

[57] ABSTRACT

Coefficient multipliers are inserted into feedback loops between an output of a delay unit and an input of an adder, and between an output of the other delay unit and the other input of the adder. Here, it is assumed that an input data supplied to an integration circuit is X(z), an output data supplied from the integration circuit is A(z), and an output data of a quantizer is Y(z). Then, the following equations are met.

$$Y(z) = X(z) + Q(1-Z^{-1})^2(1-\alpha Z^{-1})$$

where $\alpha$ is a coefficient of the coefficient multipliers.

$$A(z) = \{X(z) + Y(z) \cdot F(z) - Y(z)\}/F(z)$$

$$F(z) = (1 K_1 Z^{-1})(1-K_2 Z^{-1}) \ldots (1-K_n Z^{-1})$$

where $K_1$ to $K_n$ are coefficients of real numbers meeting the relation $0 < K_1, K_2, \ldots, K_n \leq 1$.

6 Claims, 7 Drawing Sheets

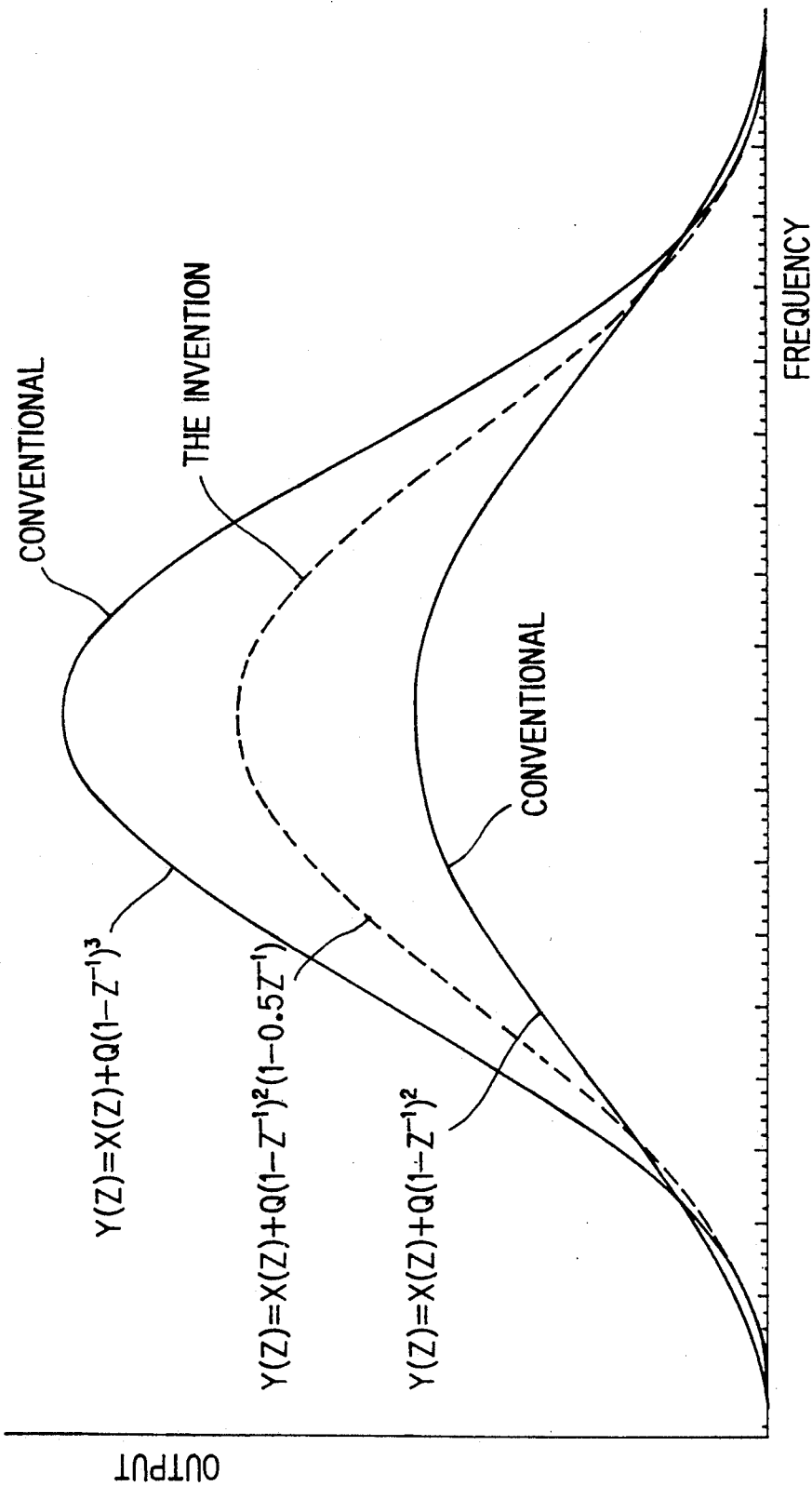

NOISE SHAPING CIRCUIT HAVING PLURAL FEEDBACK COEFFICIENT MULTIPLIERS

FIELD OF THE INVENTION

This invention relates to a noise shaping circuit, and more particularly to, a noise shaping circuit used for a digital to analog (D/A) converter, an analog to digital (A/D) converter, etc. in the field of audio apparatuses.

BACKGROUND OF THE INVENTION

A conventional noise shaping circuit is basically composed of an integration circuit and a quantizer.

In a first conventional noise shaping circuit, the integration circuit comprises serially connected first to third adders, first to third delay units each feeding an output of a corresponding one of the first to third adders back to the corresponding adder, and an additional delay unit feeding an output of the quantizer back to the first adder. Thus, the integration circuit having three integration steps is provided. In such a noise shaping circuit, the noise shaping property is improved to be proportional to the number of the integration steps.

However, the first conventional noise shaping circuit has a disadvantage in that oscillation occurs in the integration circuit, as the number of the integration steps is increased. In order to overcome this disadvantage, the precision of quantized bits is increased in the quantizer. However, this results in a complicated structure of an output circuit and the necessity of a higher frequency clock.

In a second conventional noise shaping circuit, the integration circuit comprises first to third sets of first to third adders and first to third delay units, coefficient multipliers for multiplying outputs of the second and third adders by coefficients, a limiter provided between the third adder and a corresponding one of the coefficient multiplier, and an additional delay unit feeding an output of the quantizer back to the first adder.

In a second conventional noise shaping circuit, the coefficient multipliers are provided to decrease the influence of an oscillation state, and the limiter is also provided to suppress oscillation occurring at the third integration step.

However, the second conventional noise shaping circuit has a disadvantage in that the integration circuit works only as having two of the first and second integration steps, because the limiter suppresses even the integration operation of the third integration step.

In a third conventional noise shaping circuit, the integration circuit comprises first to third coefficient multipliers, and two delay units, wherein an output of the quantizer is fed through a first path of the two delay units and the first coefficient multiplier, a second path of one of the two delay units and the second coefficient multiplier, and a third path of only the third coefficient multiplier back to the adder. In accordance with the structure, noise is decreased at an audio frequency band.

However, the third conventional noise shaping circuit has a disadvantage in that oscillation can not be avoided, although the noise shaping property is improved at the audio frequency band.

SUMMARY OF THE INVENTION

According to the invention, a noise shaping circuit includes an integration circuit having a first input receiving input data X(z), a second input, and an output outputting output data A(z). A quantizer has an input connected to the output of the integration circuit for receiving the output data A(z). The quantizer has an output coupled to the second input of the integration circuit and to an external circuit for outputting output data Y(z). The input data X(z), the output data A(z), and the output data Y(z) satisfy the relationship:

$$A(z) = \{X(z) + Y(z) \cdot F(z) - Y(z)\}/F(z)$$

where $F(z) = (1 - K_1 Z^{-1})(1 - K_2 Z^{-1}) \cdots (1 - K_n K^{-1})$, coefficients $K_1, K_2, \ldots,$ and $K_n$ are real numbers meeting a relation of $$0 \leq K_1, K_2, \ldots, K_n \leq 1.$$

BRIEF DESCRIPTION OF THE DRAWINGS

The invention will be explained in more detail in conjunction with appended drawings; wherein:

FIG. 5 is an explanatory diagram showing the characteristics compared among the first preferred embodiment and the conventional noise shaping circuits;

DESCRIPTION OF THE PREFERRED EMBODIMENTS

Before explaining a noise shaping circuit of a preferred embodiment according to the invention, the aforementioned conventional noise shaping circuits will be explained in FIGS. 1 to 3.

Figure 1:
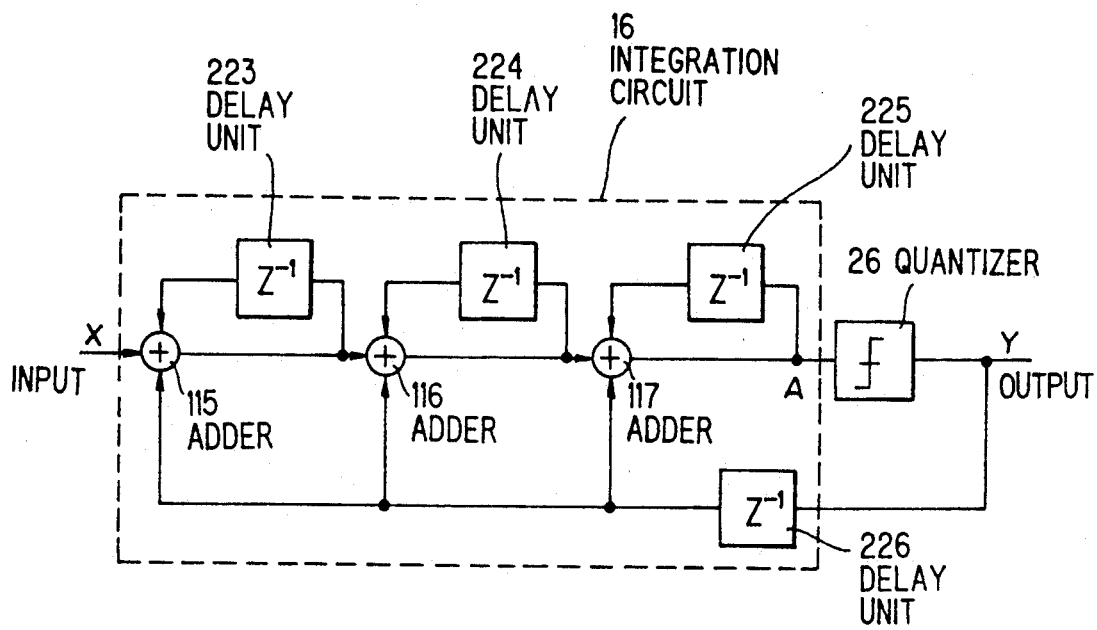
FIGS. 1 to 3 are circuit diagrams showing first to third conventional noise shaping circuits.

FIG. 1 shows the first conventional noise shaping circuit which comprises an integration circuit 16 comprising adders 115 to 117, and delay units 223 to 226, and a quantizer 26, such that a third order noise shaping circuit is structured with the third order integration circuit 16.

Here, the equation (1) is defined.

$$A(z) = \{X(z) + Y(z)(1 - Z^{-1})^3 - Y(z)\}/(1 - Z^{-1})^3 \quad (1)$$

where X(z) is an input, Y(z) is an output, and A(z) is an output of the integration circuit.

In the quantizer 26, the output of the integration circuit 16 is quantized. At this time, a quantized error Q is introduced into the relation of the output Y(z) and the output A(z) as defined by the equation (2).

$$Y(z) = A(z) + Q \quad (2)$$

In accordance with the equations (1) and (2), the equation (3) is obtained.

$$Y(z) = A(z) + Q(1 - Z^{-1})^3 \quad (3)$$

This is described in a report entitled "A-D/D-A converting technology in an oversampling system" in "Nikkei electronics, Jun. 25, 1988".

The quantized error Q is uniformly dispersed at whole frequencies. Practically, however, it is controlled to be low at a lower frequency band, and high at a higher frequency band in accordance with a noise shaping principle, so that a property is improved at the lower frequency band. Accordingly, it is required that a property of an integration circuit is improved to steep the lower frequency band property. For this purpose, the third order integration circuit 16 having the first to third steps of FIG. 1 is preferably re-structured to have fourth order, fifth order, and higher order so as to provide an improved property.

In operation, however, oscillation occurs in the integration circuit, as the number of integration steps is increased, that is, the order becomes higher.

This is because an output of the integration circuit becomes independent of an input thereof, so that it becomes a large value. In other words, this is caused due to the fact that a quantized error is not uniformly dispersed at whole frequencies in actual operation.

Figure 2:
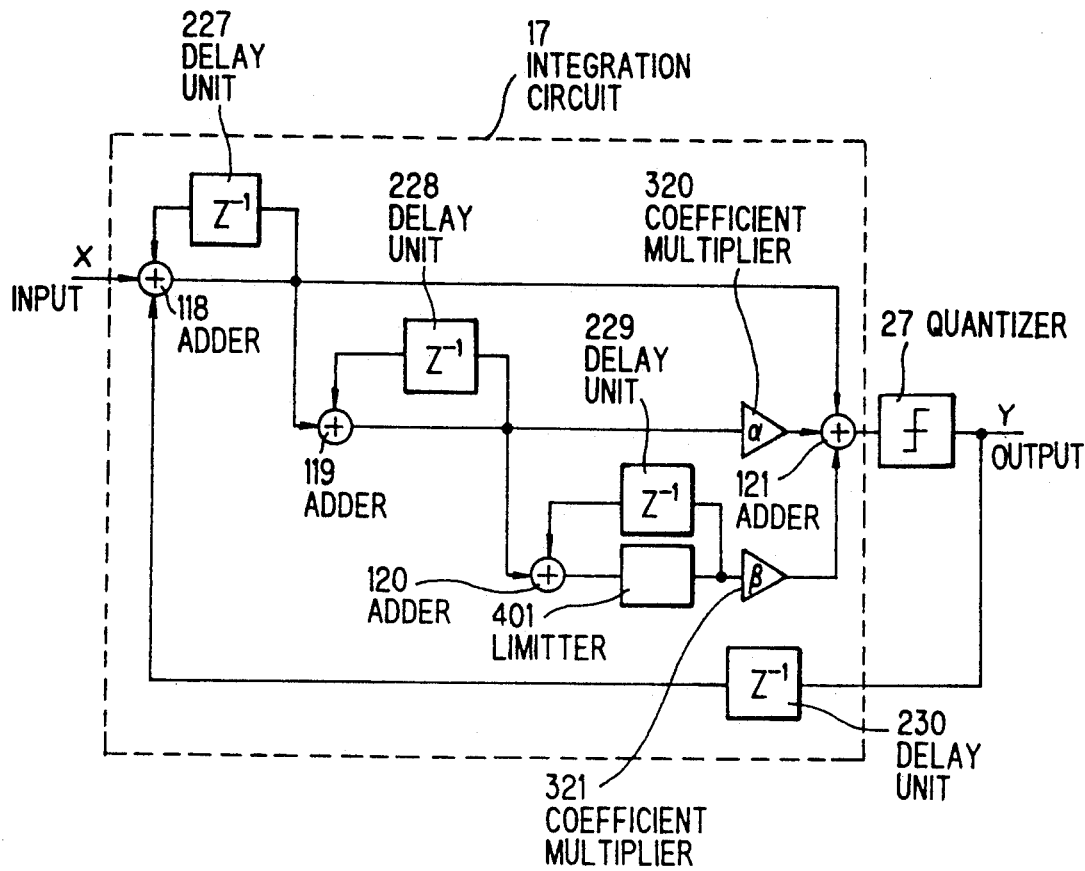

FIG. 2 shows the second conventional noise shaping circuit which comprises an integration circuit 17 comprising adders 118 to 121, delay units 227 to 230, coefficient multipliers 320 and 321, and a limiter 401, and a quantizer 27. In the integration circuit 17, a coefficient $\alpha$ (for instance, $\alpha = \frac{1}{4}$) is multiplied to the result of the second integration by the coefficient multiplier 320, and a coefficient $\beta$ (for instance, $\beta = \frac{1}{8}$) is multiplied to the result of the third integration by the coefficient multiplier 321, so that the results of the first integration and the coefficient multiplication are added to provide an integration output.

In the second conventional noise shaping circuit, the influence of oscillation caused by the third integration is relieved as described in a report entitled "Staggered delta sigma type one bit ADC/DAC simulation and experiment . measurement . waveform observation" by Kuroda in "Radio technology, February 1989".

Figure 3:
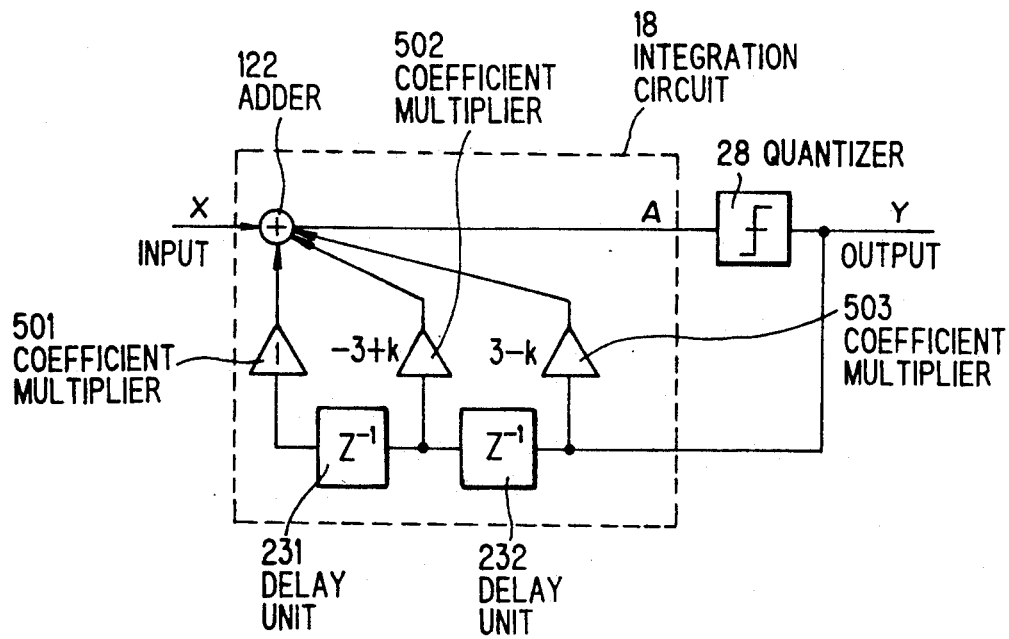

FIG. 3 shows the third conventional noise shaping circuit which comprises an integration circuit 18 comprising an adder 122, delay units 231 and 232, and coefficient multipliers 501 to 503, and a quantizer 28.

In the third conventional noise shaping circuit, an output A(z) of the integration circuit 18 is defined by the equation (4).

$$A(z) = \{X(z) + Y(z)(1-Z^{-1})(1-\alpha Z^{-1})(1-\beta Z^{-1}) - Y(z)\}/\{(1-Z^{-1})(1-\alpha Z^{-1})(1-\beta Z^{-1})\} \quad (4)$$

where $\alpha$ and $\beta$ are conjugate complex numbers to be positioned on a circle periphery of a unit circle on Z-plane.

In accordance with the equation (4), a pole of the integration circuit 18 is shifted from a point of "Z=1" on Z-axis to a point on the unit circle, so that noise is decreased at an audio frequency band as much as possible, as described in a report entitled "generating sound by design . manufacture . measurement of one bit DA processor adapted to 3f." by Kuroda in "Radio technology, May 1990".

As described above, oscillation occurs in the conventional noise shaping circuits, as the number of integration steps in an integration circuit is increased to improve a property. In order to overcome this disadvantage, the precision of quantized bits is practically heightened in a quantizer. However, this results in the complication of an output circuit together with the necessity of a higher frequency clock in the output circuit.

In the second conventional noise shaping circuit, the third order integration is carried out. However, a property is not improved as expected due to the existence of the coefficient multiplier for multiplying "$\beta$" to the third integration result, so that it works as if it is a second order integration circuit, when a limiter for suppressing oscillation of the third order integration works properly.

In the third conventional noise shaping circuit, a property is improved more or less at an audio frequency. However, oscillation occurs in the same manner as in the first and second conventional noise shaping circuits.

Figure 4:
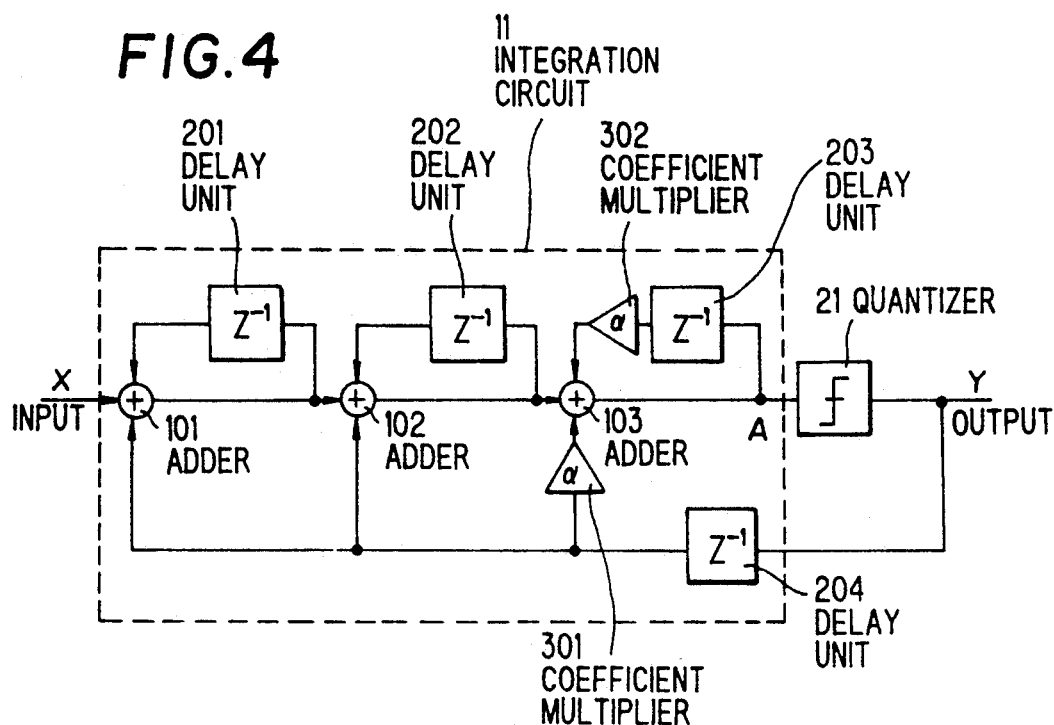
FIG. 4 is a circuit diagram showing a noise shaping circuit of first preferred embodiment according to the invention.

Next, a noise shaping circuit of a first preferred embodiment according to the invention will be explained in FIG. 4.

The noise shaping circuit comprises an integration circuit 11 comprising adders 101 to 103, delay units 201 to 204, and coefficient multipliers 301 and 302, and a quantizer 21, wherein data X(z) is supplied to an input of the adder 101 which is a first input of the integration circuit 11, an output A(z) thereof is supplied to the quantizer 21, an output Y(z) thereof is supplied to an output circuit (not shown), and the output Y(z) is also supplied to the delay unit 204 which is a second input of the integration circuit 11.

In this noise shaping circuit, the coefficient multiplier 301 having a coefficient a ($0 \leq \alpha \leq 1$) is inserted in a feedback loop between an output of the delay unit 204 and one of inputs of the adder 103, and the coefficient multiplier 302 having the coefficient $\alpha$ is inserted in a feedback loop between an output of the delay unit 203 and the other one of inputs of the adder 103.

In general, an output A(z) of an integration circuit is expressed in the invention by the equation (5).

$$A(z) = \{X(z) + Y(z) \cdot F(z) - Y(z)\}/F(z) \quad (5)$$

where $F(z) = (1 - K_1 Z^{-1})(1 - K_2 Z^{-1}) \ldots (1 - K_n Z^{-1})$, and $K_1, K_2 \ldots$ and $K_n$ are real numbers to meet the relation "$0 \leq K_1, K_2, \ldots K_n \leq 1$".

In accordance with the equations (2) and (5), the equations (6) and (7) are defined.

$$Y(z) = X(z) + F(z) \cdot Q \quad (6)$$

$$= X(z) + (1 - K_1 Z^{-1})(1 - K_2 Z^{-1}) \ldots (1 - K_n Z^{-1}) \quad (7)$$

As clearly understood from the equations (6) and (7), a quantized error Q is decreased dependent on decreasing coefficients. This is realized by inserting coefficient multipliers into feed back loops. The coefficient multipliers function also as suppressing oscillation in an integration circuit. Consequently, the improvement of a property and the avoidance of oscillation are obtained in the invention.

Referring back to FIG. 1, an output A(z) of the integration circuit 11 is expressed by the equation (8).

$$A(z) = \{(X(z) + Y(z)(1-Z^{-1})^2 - (1-\alpha Z^{-1}) - Y(z)\}/(1-Z^{-1})^2 (1-\alpha Z^{-1}) \quad (8)$$

The equation (8) means that a third order integration is carried out in the first preferred embodiment.

In accordance with the equation (7), the output Y(z) is expressed by the equation (9).

$$Y(z) = X(z) + Q(1-Z^{-1})^2(1-\alpha Z^{-1}) \quad (9)$$

In this first preferred embodiment, the coefficient $\alpha$ is inserted into the feedback loops in the integration circuit 11, so that oscillation is suppressed in the integration circuit 11, and a property is improved. As apparent from the equation (9), an approximately third order integration is realized, as the coefficient $\alpha$ is proximate to 1, while an integration property approximate to a second order integration is obtained, as the coefficient $\alpha$ is proximate to 1. Especially, the coefficient $\alpha$ is inserted in the feedback loops of the third integration step, so that oscillation is difficult to occur, and the precision of bits can be lowered in the quantizer 21.

FIG. 5 shows frequency to output characteristics, in which the coefficient $\alpha$ is 0.5 in the invention, and the second and third order integration circuits are used in the conventional noise shaping circuits, as indicated by "THE INVENTION" and "CONVENTIONAL".

In the characteristics curves, an oversampling ratio between an original sampling frequency and a frequency necessary for noise shaping is set to be 64.

Figure 6:
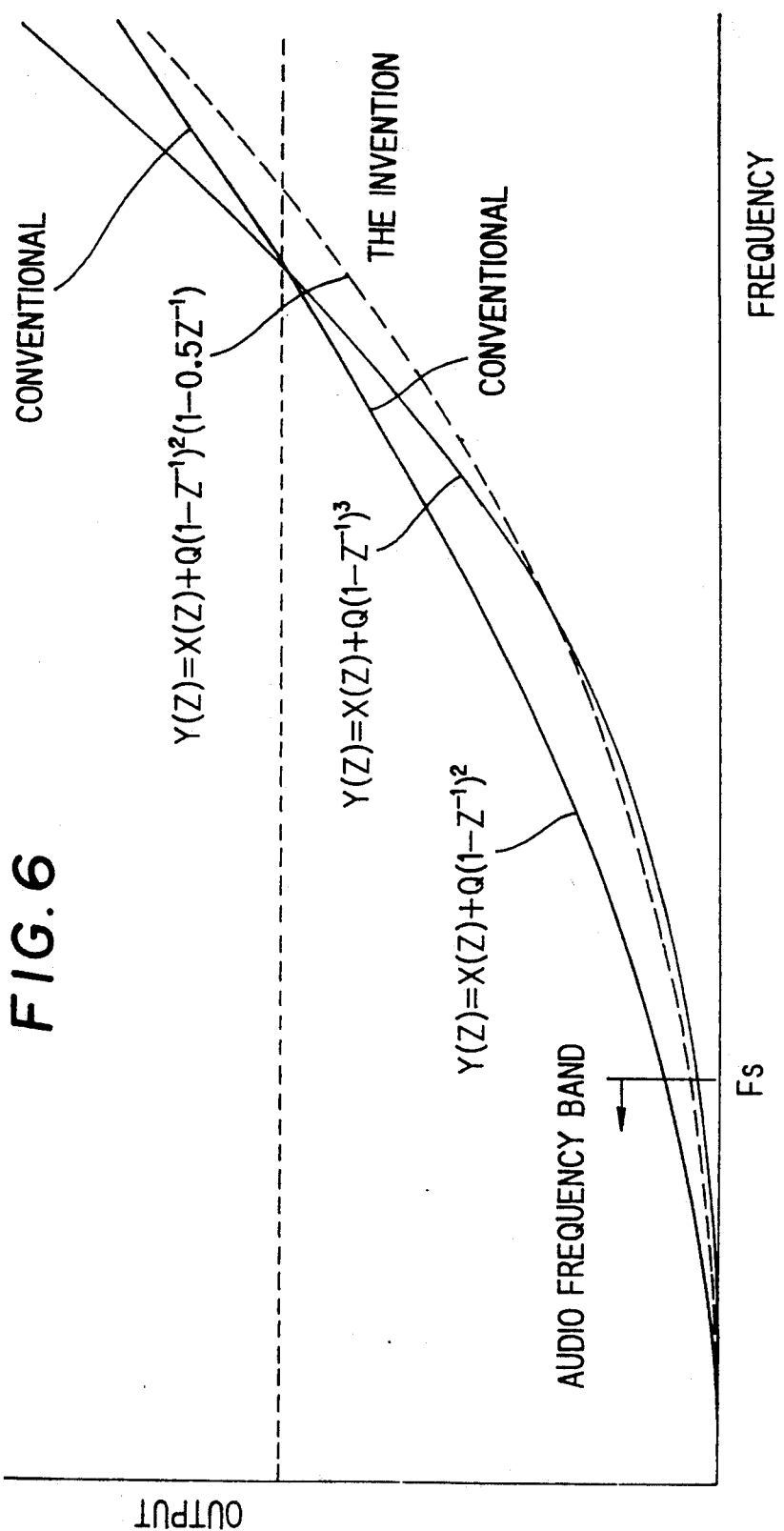
FIG. 6 is an explanatory diagram showing an enlarged portion of FIG. 5.

FIG. 6 shows a frequency component of a low frequency band in FIG. 5.

Figure 7:
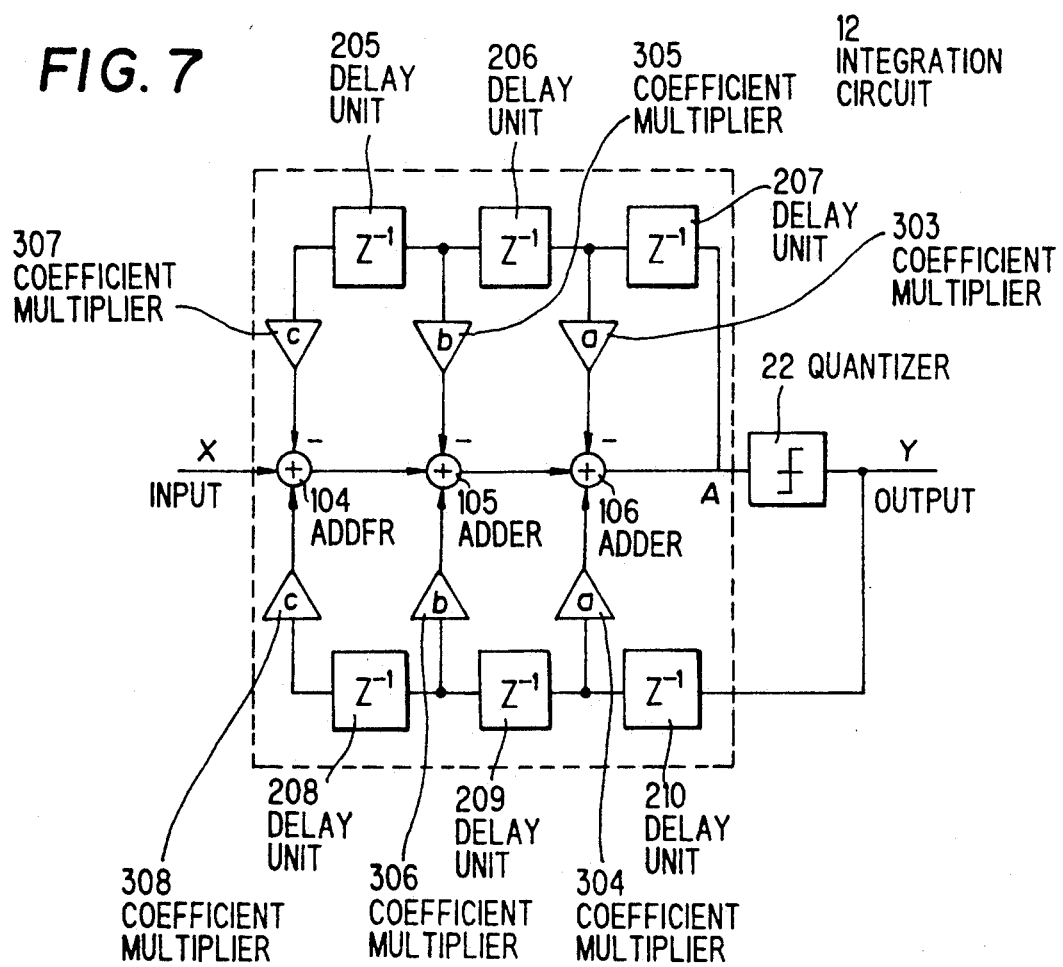
FIGS. 7 to 10 are circuit diagrams showing a noise shaping circuits of second to fifth preferred embodiment according to the invention.

FIG. 7 shows a noise shaping circuit of a second preferred embodiment according to the invention.

The noise shaping circuit comprises an integration circuit 12 comprising adders 104 to 106, delay units 205 to 210, and coefficient multipliers 303 to 308, and a quantizer 22.

In the integration circuit 12, the coefficient multipliers 303 and 304 having the same coefficient a are inserted between an output of the delay unit 207 and one of inputs of the adder 106, and between an output of the delay unit 210 and the other one of the inputs of the adder 106. Similarly, the coefficient multipliers 303 and 304 having the same coefficient b, and the coefficient multipliers 303 and 304 having the same coefficient c are provided as shown therein.

In this preferred embodiment, if the coefficient a, b, and c are set to meet the equation (10), the same characteristics as in the first preferred embodiment are obtained.

$$\left. \begin{array}{l} a = 2 + a \\ b = -(1 + 2a) \\ c = a \end{array} \right\} \qquad (10)$$

Figure 8:
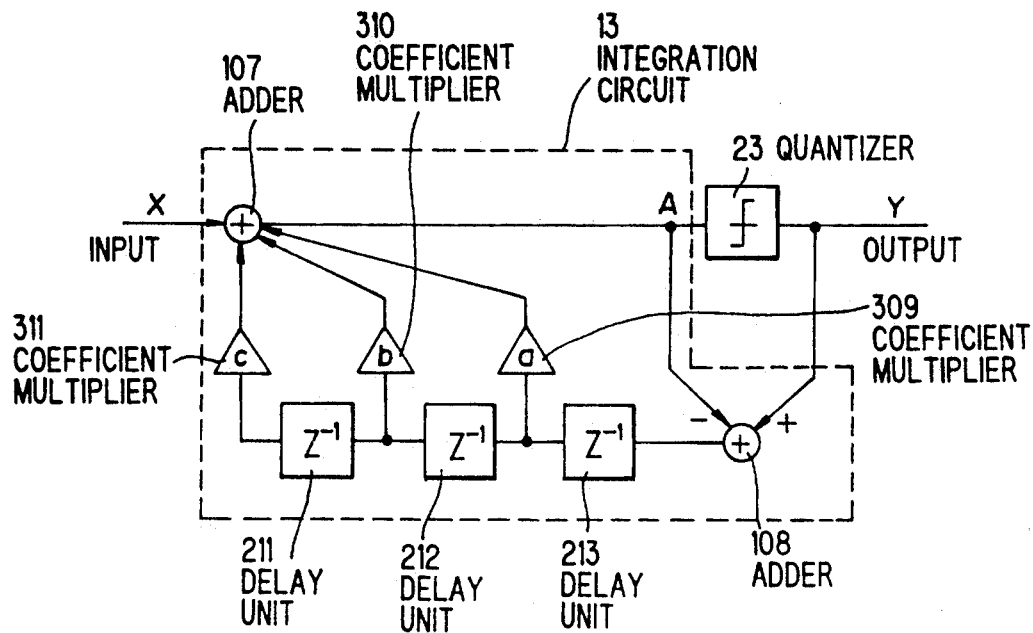

FIG. 8 shows a noise shaping circuit of a third preferred embodiment according to the invention.

The noise shaping circuit comprises an integration circuit 13 comprising adders 107 and 108, delay units 211 to 213, and coefficient multipliers 309 to 311 of coefficients a, b, and c, and a quantizer 23.

In the third preferred embodiment, the coefficient multipliers 309 to 311 are inserted between a corresponding input of the adder 107 and a corresponding output of the delay units 213, 212 and 211.

In the third preferred embodiment, if the coefficients a, b, and c meet the equation (10), the same characteristics as in the first and second preferred embodiments are obtained.

Figure 9:
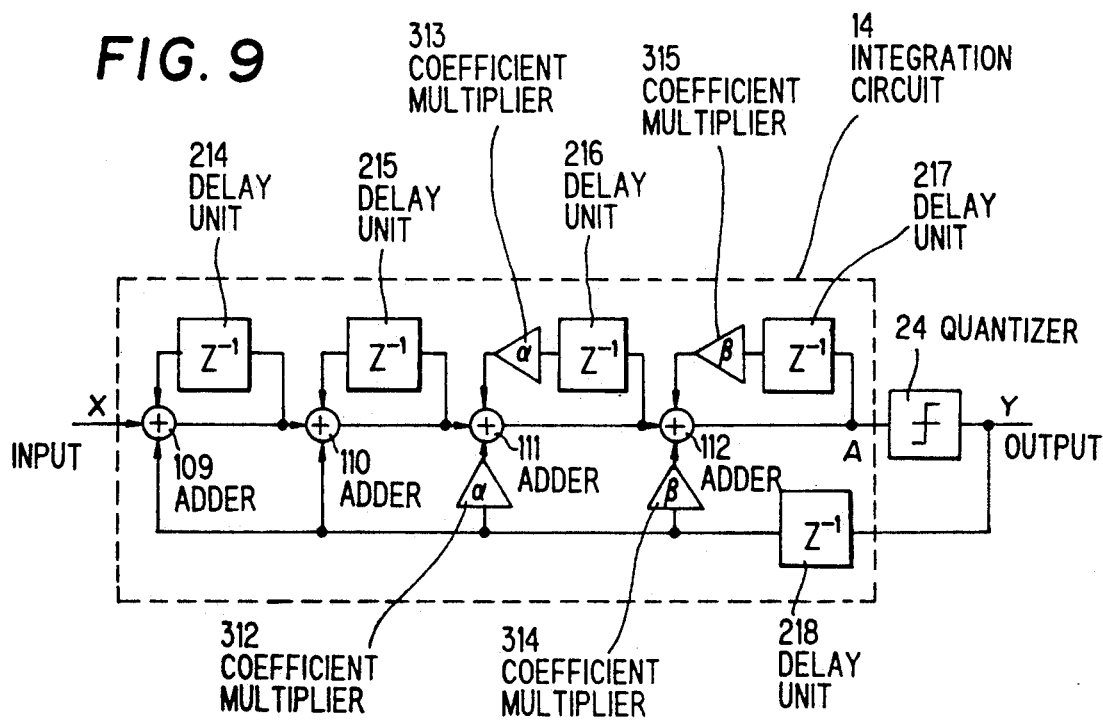

FIG. 9 shows a noise shaping circuit of a fourth preferred embodiment according to the invention.

The noise shaping circuit comprises an integration circuit 14 comprising adders 109 to 112, delay units 214 to 218, and coefficient multipliers 312 to 315, and a quantizer 24.

In the integration circuit 14, the coefficient multipliers 312 and 313 of the same coefficient $\alpha$ are inserted between an output of the delay unit 218 and an input of the adder 111, and between an output of the delay unit 216 and the other input of the adder 111, and the coefficient multipliers 314 and 315 of the same coefficient $\beta$ are inserted between an output of the delay unit 218 and an output of the adder 112, and between an output of the delay unit 217 and the other input of the adder 112, such that the coefficient $\alpha$ is multiplied to the feedback loops of the third order integration, and the coefficient $\beta$ is multiplied to the feedback loops of the fourth order integration.

For this structure, F(z) in the equation (5) is defined by the equation (11).

$$F(z)=(1-Z^{-1})^2(1-\alpha Z^{-1})(1-\beta Z^{-1}) \qquad (11)$$

The output Y(z) is obtained by the equation (12).

$$Y(z)=X(z)+Q(1-Z^{-1})^2(1-\alpha A^{-1})(1-\beta Z^{-1}) \qquad (12)$$

Consequently, the fourth order noise shaping is realized.

Figure 10:
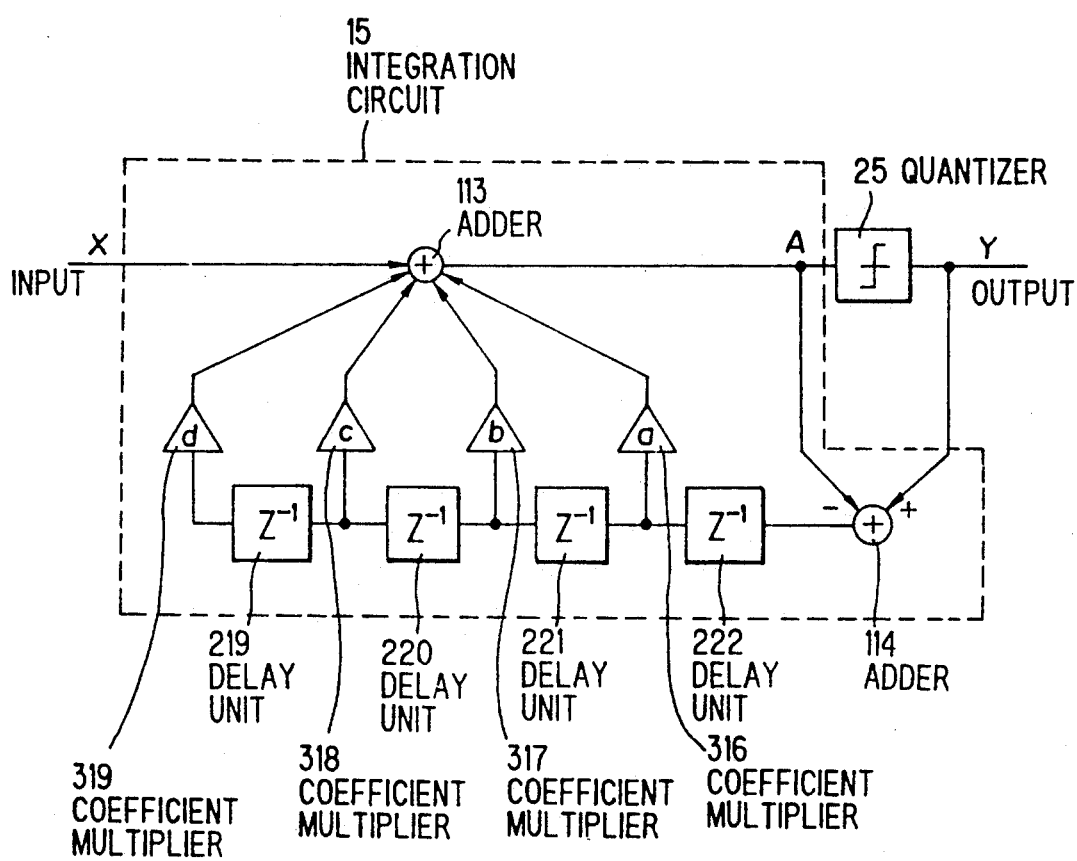

FIG. 10 shows a noise shaping circuit of a fifth preferred embodiment according to the invention.

The noise shaping circuit comprises an integration circuit 15 comprising adders 113 and 114, delay units 219 to 222, and coefficient multipliers 316 to 319, and a quantizer 25.

In the integration circuit 15, the coefficient multiplier 316 of the coefficient a, the coefficient multiplier 317 of the coefficient b, the coefficient multiplier 318 of the coefficient c, and the coefficient multiplier 319 of the coefficient d are inserted between a corresponding input of the adder 113 and an output of a corresponding one of the delay units 219 to 222.

In the preferred embodiment, if the coefficients a, b, c, and d meet the equation (11), the same characteristics as in the fourth preferred embodiment are obtained.

As described above, an integration circuit may be modified in structure, as long as it meets the equation (5).

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A noise shaping circuit comprising:
   an integration circuit having a first input receiving input data X(z), a second input, and an output outputting output data A(z); and
   a quantizer having an input connected to said output of said integration circuit for receiving the output data A(z) and an output coupled to the second input of the integration circuit and to an external circuit for outputting output data Y(z), wherein the input data X(z), the output data A(z), and the output data Y(z) satisfy the relationship:

$$A(z)=\{X(z)+Y(z)-F(z)-Y(z)\}/F(z)$$

where $F(z)=(1-K_1 Z^{-1})(1-K_2 Z^{-1}) \ldots (1-K_n Z^{-1})$, coefficients $K_1, K_2, \ldots K_n$ are real numbers meeting a relationship of $$0 \leq K_1, K_2, \ldots, K_n \leq 1.$$

2. A noise shaping circuit comprising:
an integration circuit having a first input receiving input data X(z), a second input, and an output outputting output data A(z);
a quantizer having an input connected to said output of said integration circuit for receiving the output data A(z) and an output coupled to the second input of the integration circuit and to an external circuit for outputting output data Y(z), wherein the input data X(z), the output data A(z), and the output data Y(z) satisfy the relationship:

$$A(z) = \{X(z) + Y(z) \cdot F(z) - Y(z)\}/F(z)$$

where $F(z) = (1 - K_1 Z^{-1})(1 - K_2 Z^{-1}) \ldots (1 - K_n Z^{-1})$,
coefficients $K_1, K_2, \ldots K_n$ are real numbers meeting a relationship of $$0 < K_1, K_2, \ldots, K_n < 1$$

wherein said integration circuit comprises:
first to third adders serially connected;
first to fourth delay units; and
first and second coefficient multipliers having a coefficient selected from said coefficients $K_1$ to $K_n$,
said first delay unit being connected between an output of said first adder and an input of said first adder, said second delay unit being connected between an output of said second adder and an input of said second adder, said third delay unit and said first coefficient multiplier being connected serially between an output of said third adder and an input of said third adder, and said fourth delay unit and said second coefficient multiplier being connected serially between an output of said quantizer and an input of said third adder.

3. A noise shaping circuit comprising:
an integration circuit having a first input receiving input data X(z), a second input, and an output outputting output data A(z);
a quantizer having an input connected to said output of said integration circuit for receiving the output data A(z) and an output coupled to the second input of the integration circuit and to an external circuit for outputting output data Y(z), wherein the input data X(z), the output data A(z), and the output data Y(z) satisfy the relationship:

$$A(z) = \{X(z) + Y(z) \cdot F(z) - Y(z)\}/F(z)$$

where $F(z) = (1 - K_1 Z^{-1})(1 - K_2 Z^{-1}) \ldots (1 - K_n Z^{-1})$,
coefficients $K_1, K_2, \ldots K_n$ are real numbers meeting a relationship of $$0 < K_1, K_2, \ldots, K_n < 1$$

wherein said integration circuit comprises:
first to third adders serially connected;
first to third delay units serially connected between an output of said third adder and an input of said first adder;
fourth to sixth delay units serially connected between said output of said quantizer and an input of said first adder;
first to third coefficient multipliers of first to third coefficients selected from said coefficients $K_1$ to $K_n$ connected between an input of a corresponding one of said first to third adders and an output of a corresponding one of said first to third delay units; and
fourth to sixth coefficient multipliers of said first to third coefficients connected between an input of a corresponding one of said first to third adders and an output of a corresponding one of said fourth to sixth delay units.

4. A noise shaping circuit comprising:
an integration circuit having a first input receiving input data X(z), a second input, and an output outputting output data A(z);
a quantizer having an input connected to said output of said integration circuit for receiving the output data A(z) and an output coupled to the second input of the integration circuit and to an external circuit for outputting output data Y(z), wherein the input data X(z), the output data A(z), and the output data Y(z) satisfy the relationship:

$$A(z) = \{X(z) + Y(z) \cdot F(z) - Y(z)\}/F(z)$$

where $F(z) = (1 - K_1 Z^{-1})(1 - K_2 Z^{-1}) \ldots (1 - K_n Z^{-1})$,
coefficients $K_1, K_2, \ldots K_n$ are real numbers meeting a relationship of $$0 < K_1, K_2, \ldots, K_n < 1$$

wherein said integration circuit comprises:
first and second adders, two inputs of said second adder being connected to an output of said first adder and said output of said quantizer;
first to third adders serially connected, said first delay unit being connected to an output of said second adder; and
first to third coefficient multipliers of first to third coefficients selected from said coefficients $K_1$ to $K_n$ connected between an output of a corresponding one of said first to third delay units and a corresponding one of inputs of said first adder.

5. A noise shaping circuit comprising:
an integration circuit having a first input receiving input data X(z), a second input, and an output outputting output data A(z);
a quantizer having an input connected to said output of said integration circuit for receiving the output data A(z) and an output coupled to the second input of the integration circuit and to an external circuit for outputting output data Y(z), wherein the input data X(z), the output data A(z), and the output data Y(z) satisfy the relationship:

$$A(z) = \{X(z) + Y(z) \cdot F(z) - Y(z)\}/F(z)$$

where $F(z) = (1 - K_1 Z^{-1})(1 - K_2 Z^{-1}) \ldots (1 - K_n Z^{-1})$,
coefficients $K_1, K_2, \ldots K_n$ are real numbers meeting a relationship of $$0 < K_1, K_2, \ldots, K_n < 1$$

wherein said integration circuit comprises:
first to fourth adders serially connected;
first to fifth delay units;
first and second coefficient multipliers of a first coefficient selected from said coefficients $K_1$ to $K_n$; and
third and fourth coefficient multipliers of a second coefficient selected from said coefficients $K_1$ to $K_n$,
said first delay unit being connected between an output and an input of said first adder, said second delay unit being connected between an output and an input of said second adder, said third delay unit and said first coefficient multiplier connected serially between an output and an input of said third adder, said fifth delay unit and said second coefficient multiplier connected serially between said output of said quantizer and an input of said third adder, said fourth delay unit and said third coefficient multiplier connected serially between an output and an input of said fourth adder, and said fifth delay unit and said fourth coefficient multiplier connected serially between said output of said quantizer and an input of said fourth adder.

6. A noise shaping circuit comprising:
an integration circuit having a first input receiving input data X(z), a second input, and an output outputting output data A(z);
a quantizer having an input connected to said output of said integration circuit for receiving the output data A(z) and an output coupled to the second input of the integration circuit and to an external circuit for outputting output data Y(z), wherein the input data X(z), the output data A(z), and the output data Y(z) satisfy the relationship:

$$A(z) = \{X(z) + Y(z) \cdot F(z) - Y(z)\}/F(z)$$

where $F(z) = (1 - K_1 Z^{-1})(1 - K_2 Z^{-1}) \ldots (1 - K_n Z^{-1})$,
coefficients $K_1, K_2, \ldots K_n$ are real numbers meeting a relationship of $$0 < K_1, K_2, \ldots, K_n < 1$$

wherein said integration circuit comprises:
first and second adders, two inputs of said second adder being connected to an output of said first adder and said output of said quantizer;
first to fourth delay units serially connected, said first delay unit being connected to an output of said second adder; and
first to fourth coefficient multipliers of first to fourth coefficients selected from said coefficients $K_1$ to $K_n$ connected between a corresponding input of said first adder and an output of a corresponding one of said first to fourth delay units.

* * * * *